United States Patent
Guo et al.

(10) Patent No.: US 10,270,282 B2
(45) Date of Patent: Apr. 23, 2019

(54) SOLAR CHARGER COMPRISING A CHARGING UNIT FOR CHARGING A POWER BATTERY TO A HIGH VOLTAGE, A PHOTO-SENSITIVE UNIT FOR DETECTING LIGHT INTENSITY, A SWITCH UNIT FOR REGULATING CONNECTION BETWEEN THE CHARGING UNIT AND THE POWER BATTERY, AND A CONTROL UNIT FOR REGULATING THE CHARGING OF THE POWER BATTERY BASED ON A SATURATION LEVEL AND THE LIGHT INTENSITY

(75) Inventors: Guangxi Guo, Guangdong (CN); Yang Xu, Guangdong (CN); Shulin Liang, Guangdong (CN); Jianhua Zhang, Guangdong (CN)

(73) Assignees: SHENZHEN BYD AUTO R&D COMPANY LIMITED, Shenzhen (CN); BYD COMPANY LIMITED, Shenzhen (CN)

(*) Notice: Subject to any disclaimer, the term of this patent is extended or adjusted under 35 U.S.C. 154(b) by 1435 days.

(21) Appl. No.: 13/538,016

(22) Filed: Jun. 29, 2012

(65) Prior Publication Data
US 2012/0299529 A1 Nov. 29, 2012

Related U.S. Application Data

(63) Continuation of application No. PCT/CN2010/080423, filed on Dec. 29, 2010.

(30) Foreign Application Priority Data
Dec. 31, 2009 (CN) .......................... 2009 1 0260754

(51) Int. Cl.
H02J 7/35 (2006.01)
H01L 31/042 (2014.01)
H01M 10/46 (2006.01)

(52) U.S. Cl.
CPC .............. H02J 7/35 (2013.01); H01L 31/042 (2013.01); H01M 10/465 (2013.01)

(58) Field of Classification Search
CPC .. H02J 7/00; H02J 7/35; H01M 10/44; H01M 10/465; H02N 6/00; H01L 31/042; Y02E 60/12
(Continued)

(56) References Cited

U.S. PATENT DOCUMENTS 3,668,418 A * 6/1972 Godard ........................ 307/66
3,971,454 A * 7/1976 Waterbury ............... B60K 1/04
136/291

(Continued)

FOREIGN PATENT DOCUMENTS

CN 2599851 Y 1/2004
CN 1728498 A 2/2006
(Continued)

OTHER PUBLICATIONS

"6.3 Elevated Self-Discharge," (published on Technick.net on Nov. 25, 2007, originally published in "Batteries in a Portable World," Isidor Buchmann, Cadex Electronics, http://web.archive.org/web/20071125162842/http://www.technick.net/public/code/cp_dpage.php?aiocp_dp=guide_bpw2_c06_04).*
(Continued)

*Primary Examiner* — Robert J Grant
*Assistant Examiner* — John T Trischler
(74) *Attorney, Agent, or Firm* — Anova Law Group, PLLC (57) ABSTRACT

A solar charger for charging a power battery is provided, comprising: a photo-sensitive unit configured to detect light
(Continued)

intensity; a charging unit configured to receive a voltage transformed from solar energy and to boost the voltage for charging the power battery; a switch unit coupled between the charging unit and the power battery and configured to disconnect the charging unit from the power battery or connect the charging unit with the power battery; and a control unit coupled to each of the photo-sensitive unit, the switch unit, and the charging unit, and configured to switch on the charging unit and the switch unit when the light intensity is higher than a first predetermined value to charge the power battery.

19 Claims, 4 Drawing Sheets

(58) Field of Classification Search
USPC .................. 320/101; 136/206, 243–265; 204/197.27; 323/906
See application file for complete search history.

(56) References Cited

U.S. PATENT DOCUMENTS

| | | | | |
|---|---|---|---|---|
| 4,136,309 A * | 1/1979 | Galberth et al. | | 320/102 |
| 4,187,123 A * | 2/1980 | Diggs | | 136/206 |
| 4,238,721 A * | 12/1980 | DeLuca | | H02J 7/0016 320/122 |
| 4,243,928 A * | 1/1981 | Nazimek | | H02J 7/35 136/249 |
| 4,249,520 A * | 2/1981 | Orillion | | 126/651 |
| 4,311,953 A * | 1/1982 | Fukuda | | G04G 19/00 136/293 |
| 4,328,456 A * | 5/1982 | Suzuki et al. | | 320/101 |
| 4,333,136 A * | 6/1982 | Baker | | G05F 1/67 136/293 |
| 4,551,669 A * | 11/1985 | Itoh et al. | | 323/268 |
| 4,873,480 A * | 10/1989 | Lafferty | | 323/299 |
| 5,041,952 A * | 8/1991 | Janda | | H02J 7/35 136/293 |
| 5,055,763 A * | 10/1991 | Johnson | | H02J 7/006 320/125 |
| 5,086,267 A * | 2/1992 | Janda | | H02J 7/35 136/293 |
| 5,196,781 A * | 3/1993 | Jamieson et al. | | 320/102 |
| 5,210,804 A * | 5/1993 | Schmid | | H04R 25/602 136/291 |
| 5,221,891 A * | 6/1993 | Janda | | H02J 7/35 136/293 |
| 5,293,447 A * | 3/1994 | Fanney et al. | | 392/449 |
| 5,303,305 A * | 4/1994 | Raimo | | H02J 7/355 136/291 |
| 5,510,690 A * | 4/1996 | Tanaka et al. | | 320/106 |
| 5,615,129 A * | 3/1997 | Stich | | G04C 10/00 307/66 |
| 5,627,737 A * | 5/1997 | Maekawa | | H02J 3/06 307/73 |
| 5,656,915 A * | 8/1997 | Eaves | | H01M 10/482 320/118 |
| 5,670,861 A * | 9/1997 | Nor | | B60L 11/185 307/10.7 |
| 5,686,809 A * | 11/1997 | Kimura et al. | | 320/101 |
| 5,719,555 A * | 2/1998 | Zeytoonjian et al. | | 340/571 |
| 5,773,962 A * | 6/1998 | Nor | | B60L 11/185 320/116 |
| 5,781,013 A * | 7/1998 | Takahashi | | B60L 11/1862 320/104 |
| 5,869,951 A * | 2/1999 | Takahashi | | G01R 31/361 320/104 |
| 5,932,994 A * | 8/1999 | Jo et al. | | 323/222 |
| 6,058,035 A * | 5/2000 | Madenokouji et al. | | 363/95 |
| 6,204,645 B1 * | 3/2001 | Cullen | | G05F 1/67 320/102 |
| 6,271,642 B1 * | 8/2001 | Dougherty | | G08B 29/181 320/104 |
| 6,404,163 B1 * | 6/2002 | Kapsokavathis | | H02J 7/0029 320/104 |
| 6,452,361 B2 * | 9/2002 | Dougherty | | G08B 29/181 320/104 |
| 6,476,583 B2 * | 11/2002 | McAndrews | | H02J 7/0013 320/119 |
| 6,493,246 B2 * | 12/2002 | Suzui | | H02J 7/35 323/906 |
| 6,630,622 B2 * | 10/2003 | Konold | | 136/246 |
| 6,700,351 B2 * | 3/2004 | Blair | | H02J 7/0022 320/125 |
| 6,765,363 B2 * | 7/2004 | LaFollette et al. | | 320/107 |
| 6,815,931 B1 * | 11/2004 | Wells | | H02J 4/00 320/155 |
| 6,867,568 B1 * | 3/2005 | Olson | | H02J 7/0073 320/137 |
| 6,891,354 B2 * | 5/2005 | Fazakas | | G01R 19/0053 320/137 |
| 6,897,423 B2 * | 5/2005 | Redler et al. | | 250/203.4 |
| 7,068,017 B2 * | 6/2006 | Willner et al. | | 323/272 |
| 7,269,036 B2 * | 9/2007 | Deng | | H02J 7/35 323/901 |
| 7,433,215 B2 * | 10/2008 | Taylor | | H02J 7/35 136/244 |
| 7,453,235 B2 * | 11/2008 | Blair | | H02J 7/0022 320/116 |
| 7,456,523 B2 * | 11/2008 | Kobayashi | | H02M 7/493 307/82 |
| 7,466,571 B2 * | 12/2008 | Deng | | H02J 7/35 323/906 |
| 7,706,164 B2 * | 4/2010 | Nishi et al. | | 363/146 |
| 7,967,465 B2 * | 6/2011 | Richmond | | 362/183 |
| 8,264,194 B1 * | 9/2012 | Spangler | | G06F 1/3265 320/101 |
| 8,581,550 B2 * | 11/2013 | Lin | | H02J 7/0055 320/123 |
| 8,952,665 B1 * | 2/2015 | Spangler | | G06F 1/263 320/162 |
| 9,024,585 B2 * | 5/2015 | Nakashima | | H02J 7/0019 320/117 |
| 2001/0033502 A1 * | 10/2001 | Blair | | H02J 7/0022 363/65 |
| 2002/0000243 A1 * | 1/2002 | Ganz | | 136/244 |
| 2002/0008495 A1 * | 1/2002 | Dougherty | | G08B 29/181 320/104 |
| 2002/0014880 A1 * | 2/2002 | McAndrews | | H02J 7/0013 320/134 |
| 2002/0074034 A1 * | 6/2002 | Fujisaki et al. | | 136/246 |
| 2003/0006737 A1 * | 1/2003 | LaFollette et al. | | 320/137 |
| 2004/0066173 A1 | 4/2004 | Reynolds | | |
| 2004/0110459 A1 * | 6/2004 | Snow | | 454/137 |
| 2004/0160214 A1 * | 8/2004 | Blair | | H02J 7/0022 320/118 |
| 2005/0121067 A1 * | 6/2005 | Toyomura et al. | | 136/244 |
| 2005/0133082 A1 * | 6/2005 | Konold et al. | | 136/246 |
| 2005/0168194 A1 * | 8/2005 | Stanesti et al. | | 320/134 |
| 2005/0242776 A1 * | 11/2005 | Emori | | B60L 11/1855 320/116 |
| 2006/0017423 A1 * | 1/2006 | Frith et al. | | 323/268 |
| 2006/0118162 A1 * | 6/2006 | Saelzer et al. | | 136/246 |
| 2006/0152224 A1 * | 7/2006 | Kim | | G01R 31/3662 324/430 |
| 2006/0249195 A1 * | 11/2006 | Taylor | | H02J 7/35 136/244 |
| 2007/0023078 A1 * | 2/2007 | Palladino | | 136/244 |
| 2007/0084498 A1 * | 4/2007 | Taylor | | H02J 7/35 136/206 |
| 2008/0058995 A1 * | 3/2008 | Holindrake et al. | | 700/284 |
| 2008/0084117 A1 * | 4/2008 | Sander et al. | | 307/46 |
| 2008/0084645 A1 * | 4/2008 | Ahmad, Jr. | | 361/103 |
| 2008/0101101 A1 * | 5/2008 | Iwata | | H02M 7/5387 363/71 |
| 2008/0143292 A1 * | 6/2008 | Ward | | 320/101 |
| 2008/0169784 A1 * | 7/2008 | Chung et al. | | 320/101 |

(56) References Cited

U.S. PATENT DOCUMENTS

| | | | |
|---|---|---|---|
| 2008/0211451 A1* | 9/2008 | Zhang | H01L 31/02021 320/101 |
| 2008/0224652 A1* | 9/2008 | Zhu et al. | 320/101 |
| 2008/0238354 A1* | 10/2008 | Chang | 320/101 |
| 2008/0315828 A1* | 12/2008 | Lu et al. | 320/101 |
| 2009/0000659 A1* | 1/2009 | Hasegawa et al. | 136/252 |
| 2009/0001926 A1* | 1/2009 | Sato | 320/102 |
| 2009/0032082 A1* | 2/2009 | Gilmore et al. | 136/244 |
| 2009/0039839 A1* | 2/2009 | Noguchi | B60L 11/1887 323/234 |
| 2009/0078300 A1* | 3/2009 | Ang | F03G 6/001 136/244 |
| 2009/0079385 A1* | 3/2009 | Xiao et al. | 320/102 |
| 2009/0121549 A1* | 5/2009 | Leonard | H02M 3/156 307/51 |
| 2009/0183760 A1* | 7/2009 | Meyer | H01L 31/02008 136/244 |
| 2009/0207596 A1* | 8/2009 | Richmond | 362/159 |
| 2009/0309549 A1* | 12/2009 | Shih | G01R 31/362 320/136 |
| 2010/0082171 A1* | 4/2010 | Takehara et al. | 700/286 |
| 2010/0156355 A1* | 6/2010 | Bauerle | B60L 3/003 320/145 |
| 2010/0168926 A1* | 7/2010 | Bayley et al. | 700/282 |
| 2010/0273080 A1* | 10/2010 | Noguchi | B60L 11/1881 429/442 |
| 2010/0308662 A1* | 12/2010 | Schatz et al. | 307/80 |
| 2011/0006194 A1* | 1/2011 | Pereira Morais Dos Santos et al. | 250/208.2 |
| 2011/0062913 A1* | 3/2011 | Lin | H02J 7/0055 320/101 |
| 2011/0175454 A1* | 7/2011 | Williams et al. | 307/82 |
| 2012/0091943 A1* | 4/2012 | Manor et al. | 320/101 |
| 2012/0112541 A1* | 5/2012 | Beghelli | F24J 2/52 307/29 |
| 2012/0112684 A1* | 5/2012 | Xu et al. | 320/101 |
| 2012/0133322 A1* | 5/2012 | Walsh et al. | 320/101 |
| 2012/0223584 A1* | 9/2012 | Ledenev | 307/82 |
| 2013/0127392 A1* | 5/2013 | Rugolo | H02J 7/0042 320/101 |
| 2013/0134785 A1* | 5/2013 | O'Brien | H02M 7/487 307/71 |
| 2013/0193904 A1* | 8/2013 | Rugolo | H02J 7/0042 320/101 |
| 2013/0200860 A1* | 8/2013 | Takeda | H02J 7/0024 320/167 |
| 2013/0320911 A1* | 12/2013 | Kamiya | H02J 7/025 320/101 |
| 2014/0095018 A1* | 4/2014 | Atluri | B60L 1/00 701/36 |
| 2014/0340042 A9* | 11/2014 | Emori | B60L 3/0046 320/116 |

FOREIGN PATENT DOCUMENTS

| | | | | |
|---|---|---|---|---|
| CN | 200990520 Y | * | 12/2007 | |
| CN | 201023493 Y | * | 2/2008 | |
| CN | 201141544 Y | | 10/2008 | |
| DE | 3316775 A1 | * | 11/1984 | G05F 1/66 |
| EP | 1993186 A1 | | 11/2008 | |
| JP | 08149833 A | * | 6/1996 | H02M 7/48 |
| JP | 10201268 A | * | 7/1998 | H02N 6/00 |
| JP | 2001268815 A | * | 9/2001 | H02J 7/02 |
| WO | WO 2009/035995 A1 | | 3/2009 | |
| WO | WO 2011/079789 A1 | | 7/2011 | |

OTHER PUBLICATIONS

"Solar Regulator and Inverter Basics," Michael Bloch, Greenlivingtips.com, Published online Jun. 22, 2008, Accessed Online Jun. 12, 2015, http://www.greenlivingtips.com/articles/solar-regulators-and-inverters.html.*

"Drum Digital Servo Controller: Power Ratings up to 100V," Elmo Motion Control, Published Online Jul. 5, 2008, Accessed Online Jun. 12, 2015, http://web.archive.org/web/20080705220735/http://www.elmomc.com/products/drum-elmo-dc-powered-digital-servo-drive.htm.*

"State of Health (SOH) Determination," Electropaedia, Mpower, Published May 11, 2008, Accessed Mar. 16, 2015, https://web.archive.org/web/20080511160803/http://www.mpoweruk.com/soh.htm.*

"Chargers and Charging," Electropaedia, MPowerUK, Published May 9, 2008, Accessed Online Jun. 12, 2015, http://web.archive.org/web/20080509075619/http://www.mpoweruk.com/chargers.htm.*

Derwent Report for CN 201113502 Y, inventor Fan Z, Published Sep. 10, 2008, Accessed Online Jun. 12, 2015.*

Derwent Report for JP 11037570 A, Inventor Nakano M et al, Published Feb. 12, 1999, Accessed Online Jun. 12, 2015.*

English Translation of CN 201023493CNY, Chinese Document Published Feb. 2008, Translation Provided by STIC Jun. 9, 2015.*

"Powering an LED off of a 36volt power source," bvhm and therealciviczc, Candle Power Forums, Published Aug. 17, 2009, Accessed Oct. 8, 2015, www.candlepowerforums.com/vb/showthread.php?237348-Powering-an-LED-off-of-a-36volt-power-source.*

"State of Charge Determination," Electropaedia, mpoweruk, Published May 9, 2008, Accessed Apr. 2, 2015, http://web.archive.org/web/20080509145838/http://www.mpoweruk.com/soc.htm.*

"Why there won't be a solar powered car," Les Jackson, The Washington Times, Published Jul. 26, 2008, Accessed online Mar. 1, 2016, http://www.washingtontimes.com/blog/spinning-wheels-community-car-lovers/2008/jul/26/why-there-wont-be-a-solar-powered-car/.*

"18 Wheeler Flat Bed Trailer Dimensions?," Russell Thompson, Published 2008, Accessed online Mar. 1, 2016, https://answers.yahoo.com/question/index?qid=20080909190311AAHGXVO.*

Machine Translation of Frith (CN1728488) by espacenet (Chinese Patent Document Provided in Earlier Action).*

"How does a float charger work?" BatteryFloatChargers, Published Online Oct. 1, 2002 [as dated by google for when the Quara document was published which explicitly cites the document being evidenced], Accessed Online Sep. 23, 2016, https://www.quora.com/What-is-float-charging which has a hyperlink to the document http://www.batteryfloatchargers.com/how.*

USPTO Human Translation of Frith et al CN1728498A.*

PCT International Search Report and Written Opinion dated Mar. 31, 2011, issued in International Application No. PCT/CN2010/080423 (9 pages).

Supplementary European Search Report dated Apr. 9, 2014, issued in related European Patent Application No. 10840577.0 (6 pages).

* cited by examiner

SOLAR CHARGER COMPRISING A CHARGING UNIT FOR CHARGING A POWER BATTERY TO A HIGH VOLTAGE, A PHOTO-SENSITIVE UNIT FOR DETECTING LIGHT INTENSITY, A SWITCH UNIT FOR REGULATING CONNECTION BETWEEN THE CHARGING UNIT AND THE POWER BATTERY, AND A CONTROL UNIT FOR REGULATING THE CHARGING OF THE POWER BATTERY BASED ON A SATURATION LEVEL AND THE LIGHT INTENSITY

CROSS-REFERENCE TO RELATED APPLICATIONS

The present application is a continuation of International Application No. PCT/CN2010/080423, filed Dec. 29, 2010, which claims the priority and benefits of Chinese Patent Application No. 200910260754.X, filed with China Patent Office on Dec. 31, 2009, the entirety of both of which are incorporated herein by reference.

BACKGROUND

Technical Field

The present disclosure relates to a solar charger for charging a power battery in an electric vehicle.

Description of the Related Art

The electric bus that is currently in use typically does not have power batteries or solar chargers, and is driven along a track via power lines. These constraints limit the range and areas that the electric bus can serve.

It is well-known that solar energy is pollution-free and easily obtainable. Solar chargers, however, are conventionally used for low-power devices such as cell phones, cameras and emergency lamps, but rarely used for devices and machines that require high power, such as electric buses.

The present disclosure relates to a solar charger for devices and machines that require high power, such as electric buses and vehicles.

SUMMARY

An embodiment of the present disclosure provides a solar charger for charging a power battery, comprising: a photo-sensitive unit configured to detect light intensity; a charging unit configured to receive a voltage transformed from solar energy and to boost the voltage for charging the power battery; a switch unit coupled between the charging unit and the power battery and configured to disconnect the charging unit from the power battery or connect the charging unit with the power battery; and a control unit coupled to each of the photo-sensitive unit, the switch unit, and the charging unit, and configured to switch on the charging unit and the switch unit when the light intensity is higher than a first predetermined value to charge the power battery.

By using the solar charger in the present disclosure, the charging unit may boost the voltage transformed from the solar energy, and provide the voltage to the power battery under the control of the control unit to charge the power battery.

BRIEF DESCRIPTION OF THE DRAWINGS

These and other aspects and advantages of the disclosure will become apparent and more readily appreciated from the following descriptions taken in conjunction with the drawings.

DETAILED DESCRIPTION

Reference will be made in detail to embodiments of the present disclosure. The embodiments described herein with reference to drawings are explanatory and illustrative, and are used to generally understand the present disclosure. The embodiments shall not be construed to limit the present disclosure. Same or similar elements and elements having the same or similar functions are denoted by common reference numerals throughout the descriptions.

Figure 1:
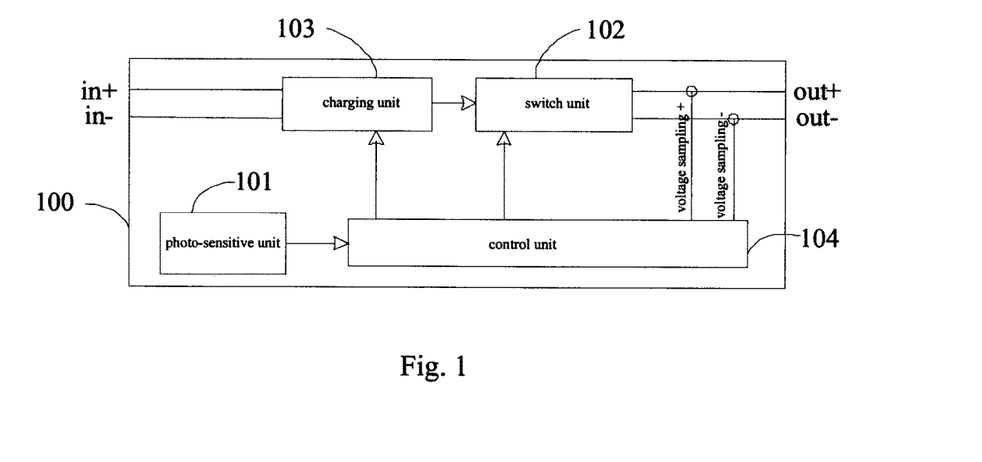
FIG. 1 is a schematic diagram of the solar charger according to a first embodiment of the present disclosure.

As shown in a first embodiment in FIG. 1, the solar charger 100 comprises: a photo-sensitive unit 101, a switch unit 102, a charging unit 103, and a control unit 104. The control unit 104 is coupled to each of the photo-sensitive unit 101, the switch unit 102, and the charging unit 103.

The photo-sensitive unit 101 is configured to detect the light intensity and to send the light intensity to the control unit 104. For example, the photo-sensitive unit 101 may include a photo-sensitive resistor or other photo-sensitive components.

The switch unit 102 is coupled between the charging unit 103 and the power battery and configured to disconnect the charging unit 103 from the power battery or connect the charging unit 103 with the power battery under the control of the control unit 104. For example, the switch unit 102 may be a relay. When the solar charger 100 satisfies the charging conditions, the control unit 104 may switch on the relay to allow the charging unit 103 to charge the power battery under the control of the control unit 104. When the solar charger 100 does not satisfy the charging conditions, the control unit 104 may switch off the relay to disconnect the charging unit 103 from the power battery and to stop the solar charger 100 from charging the power battery. The relay has different resistance properties depending on whether the relay is switched on or off. For example, the relay has excellent electrical insulation when the relay is switched off, but is conductive when the relay is switched on. Therefore, the relay can effectively disconnect the charging unit 103 from the power battery when the relay is switched off, to avoid damaging the control unit 104 when a voltage input into the charging unit 103 is sampled at the output voltage sampling line (corresponding to the voltage sampling + and the voltage sampling − in FIG. 1) when the charging of the power battery is stopped. Also, the charging performance of the solar charger 100 may not be affected when the relay is switched on.

The charging unit 103 is configured to receive a voltage that has been transformed from solar energy and input into the charging unit 103, and to boost the voltage and provide the voltage to the power battery under the control of the control unit 104 when the switch unit 102 is switched on. In some embodiments, the device for transforming the solar energy into the voltage may be a solar battery board. The charging unit 103 may boost the voltage (for example, 320V) that is output from the solar battery board to the power battery voltage (for example, 570V), which is higher than the voltage output from the solar battery board, to charge the power battery.

The control unit 104 is configured to receive the light intensity provided by the photo-sensitive unit 101. When the light intensity is higher than a first predetermined value (for example, a value of no less than 50 lux), the control unit 104 switches on the charging unit 103 and the switch unit 102 to allow the charging unit 103 to charge the power battery. The control unit 104 monitors the voltage of the power battery, and switches off the charging unit 103 and the switch unit 102 when the voltage of the power battery reaches a saturation value (for example, 570 V). It is noted that the saturation value of the power battery can have different values based on the capacities of element cells in the power battery and the number of the element cells. The control unit 104 may monitor the power battery voltage through the voltage samplings at the output end of the solar charger 100 in FIG. 1 (the voltage sampling + and the voltage sampling − in FIG. 1).

As shown in FIG. 1, "in+" and "in−" refer to a positive input terminal and a negative input terminal of the solar charger 100, respectively, and "out+" and "out−" refer to a positive output terminal and a negative output terminal of the solar charger 100, respectively. The positive input terminal and the negative input terminal of the solar charger 100 may be coupled to a solar harvesting device (such as the solar battery board) via a service switch (not shown), and the positive output terminal and the negative output terminal may be coupled to the power battery via another service switch (not shown).

By using the solar charger 100, the charging unit 103 can boost the voltage that has been transformed from the solar energy and input into the charging unit 103, and provide the voltage to the power battery under the control of the control unit 104 to charge the power battery.

Figure 2:
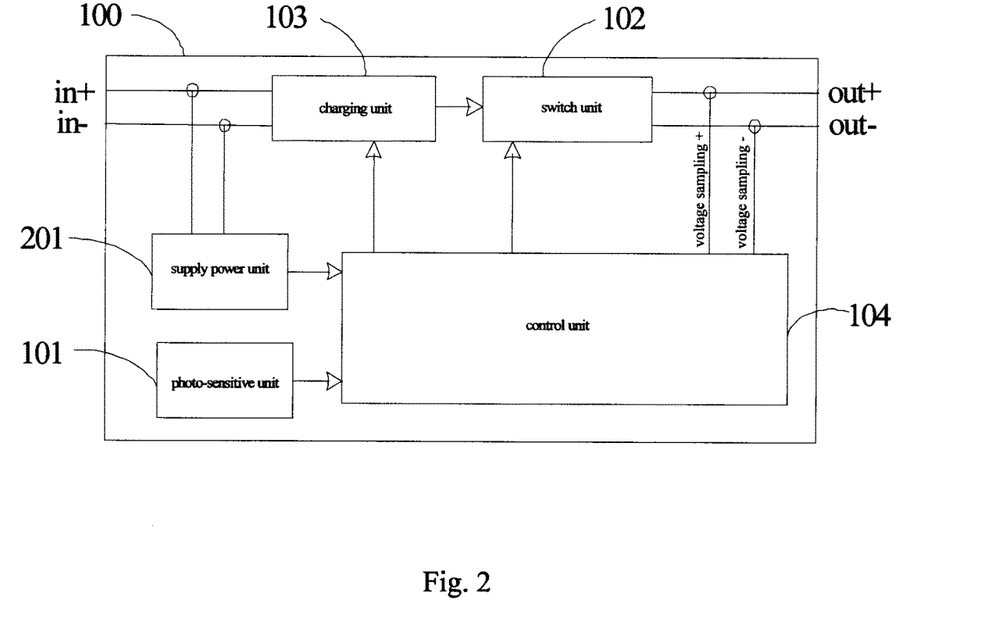
FIG. 2 is a schematic diagram of the solar charger according to a second embodiment of the present disclosure.

In a second embodiment shown in FIG. 2, the solar charger 100 further comprises a power battery unit 201 coupled to the control unit 104, and configured to receive and stabilize the voltage that has been transformed from the solar energy and input into the charging unit 103 to power the control unit 104; and when the voltage transformed from the solar energy reaches a second predetermined value, the control unit 104 starts to operate. Thus, when the voltage input into the charging unit 103 is lower than the second predetermined value, the control unit 104 may not operate, which prevents the solar charger 100 from operating. When the voltage input into the charging unit 103 reaches or is higher than the second predetermined value, the solar charger 100 can then start to operate. In some embodiments, the second predetermined value may be no less than 12 V, and an exemplary value may be 80 V. The second predetermined value can have different values depending on the actual operating conditions. Typically, when the voltage input into the charging unit 103 is higher than a predetermined value (for example, 100 V), the control unit 104 may switch on the charging unit 103. In one embodiment, the second predetermined value is less than a minimum voltage that is input into the charging unit 103 when the control unit 104 switches on the charging unit 103.

In the second embodiment, the control unit 104 is configured to periodically switch on the switch unit 102 (for example, at intervals of 30 minutes) to detect the current voltage of the power battery after the voltage of the power battery reaches a saturation value, and to switch on the charging unit 103 and the switch unit 102 to charge the power battery when the current voltage of the power battery is lower than the saturation value (for example, 570 V) and the light intensity detected by the photo-sensitive unit is higher than the first predetermined value. In this embodiment, an abrupt change in the output current of the power battery can be prevented when the electric bus or vehicle is being driven, and this can reduce damage to the power battery due to large currents, maintain the performance of the power battery, and prolong the life of the power battery. The periodic time T for periodically switching on the switch unit 102 can be determined based on the capacity and the energy dissipation of the power battery, where T typically ranges from about 10 minutes to about 50 minutes. Also, the control unit 104 switches on the switch unit 102 to detect the current voltage of the power battery at intervals of T.

In the second embodiment, the control unit 104 is further configured to periodically compare (for example, every 3 minutes) the current light intensity detected by the photo-sensitive unit 101 with the first predetermined value, to switch off the charging unit 103 and the switch unit 102 if the current light intensity is lower than the first predetermined value, and to switch on the charging unit 103 and the switch unit 102 if the current light intensity is higher than the first predetermined value, thereby ensuring that the power battery is not charged at low light intensity. In addition, the periodic time for periodically comparing the light intensity with the first predetermined value may range from about 0.5 minutes to about 10 minutes.

In the second embodiment, the control unit 104 is further configured to communicate with an external control device (such as a battery manager or a display device) and to control the charging unit 103 and the switch unit 102 according to instructions from the external control device. For example, the control unit 104 may switch off the charging unit 103 and the switch unit 102 if the control unit 104 receives instructions of fast or slow charging before the solar charger 100 charges the power battery. Thus, the power battery may be charged via a mains supply. If the control unit 104 receives instructions of fast or slow charging during the charging process of the solar charger 100 for the power battery, the control unit 104 may switch off the charging unit 103 and the switch unit 102, and the power battery may be charged via the mains supply. Therefore, the solar charger 100 of the present disclosure may satisfy various needs for charging, for example, fast charging or slow charging.

Figure 3:
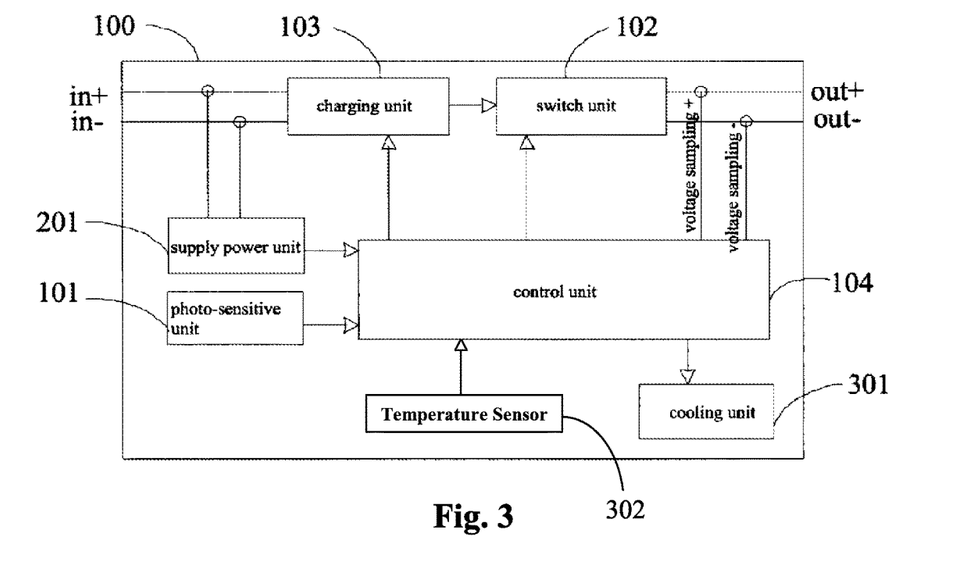
FIG. 3 is a schematic diagram of the solar charger according to a third embodiment of the present disclosure.

In a third embodiment of the present disclosure, as shown in FIG. 3, the solar charger 100 may further comprise a cooling unit 301 coupled to the control unit 104. The cooling unit 301 is configured to cool the solar charger 100 when a temperature of the solar charger 100 detected by the control unit 104 reaches a third predetermined value, thus ensuring reliable operation of the solar charger 100. The third predetermined value may range from about 40° C. to about 100° C., and an exemplary value may be 85° C. The temperature of the solar charger 100 can be detected by a temperature sensor 302, and because the charging unit 103 is the main energy transforming component, the temperature near the charging unit 103 should preferably be detected.

As shown in FIGS. 1 to 3, the switch unit 102 is coupled to the positive and negative output terminals of the solar charger 100. It is noted that in practice, the switch unit 102 can be coupled to one of the positive or negative output terminals of the solar charger 100.

Figure 4:
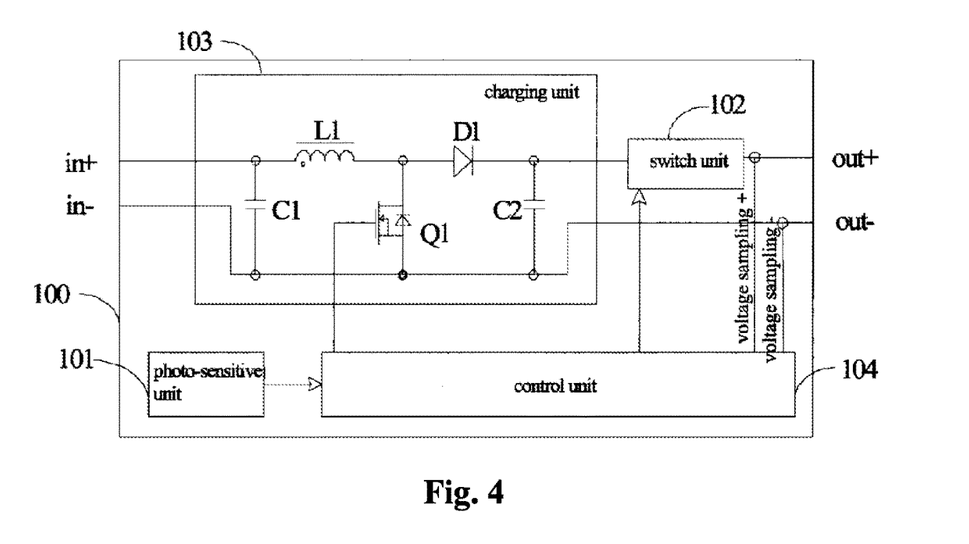
FIG. 4 is a schematic diagram of the solar charger according to a fourth embodiment of the present disclosure.

In a fourth embodiment shown in FIG. 4, the charging unit 103 may comprise: a first capacitor C1 having a first end coupled to the positive input terminal of the solar charger 100 and a second end coupled to the negative input terminal of the solar charger 100; a first inductance L1 having a first end coupled to the positive input terminal of the solar charger 100; a first diode D1 having a positive end coupled to a second end of the first inductance L1; a MOSFET Q1 having a gate electrode coupled to the control unit 104, a drain electrode coupled to the second end of the first inductance L1, and a source electrode coupled to the second end of the first capacitor C1; and a second capacitor C2 having a first end coupled to a negative end of the first diode D1 and a second end coupled to the second end of the first capacitor C1. The negative end of the diode D1 is coupled to one end of the switch unit 102, the other end of the switch unit 102 is coupled to the positive output terminal of the solar charger 100, and the negative output terminal of the solar charger 100 can be coupled to the negative input terminal, which ensures that the solar charger 100 transforms from low voltage to high voltage. In FIG. 4, the diode between the source electrode and the drain electrode of the MOSFET Q1 is a built-in diode.

Figure 5:
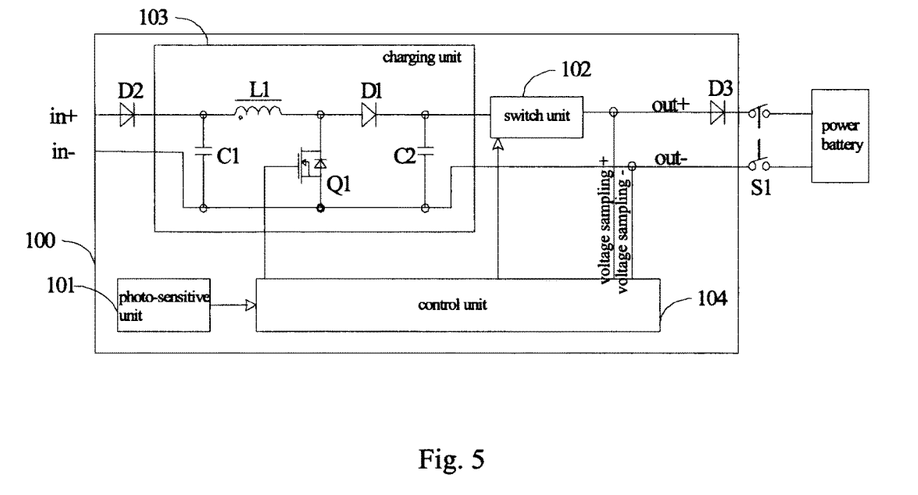
FIG. 5 is a schematic diagram of the solar charger according to a fifth embodiment of the present disclosure.

In a fifth embodiment shown in FIG. 5, the solar charger 100 may further comprise: a second diode D2 having a positive end coupled to the positive input terminal of the solar charger 100 and a negative end coupled to a positive input end of the charging unit 103, and this can prevent damage to the solar charger 100 when the positive and negative input terminals of the solar charger 100 are inversely connected. Meanwhile, the solar charger 100 may further comprise a third diode D3 having a positive end coupled to an output end of the switch unit 102 and a negative end coupled to the power battery, and this can prevent the voltage of the power battery from affecting the output voltage sampling of the solar charger 100 during the charging and non-charging periods.

Figure 6:
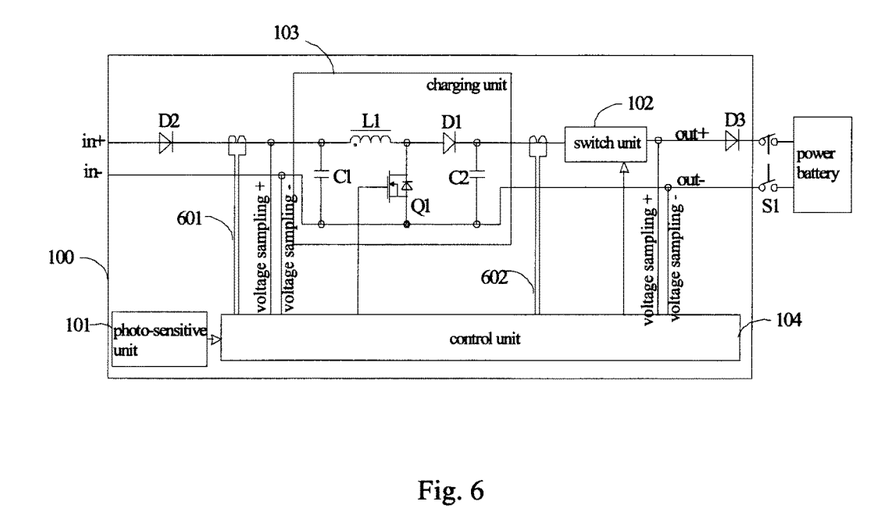
FIG. 6 is a schematic diagram of the solar charger according to a sixth embodiment of the present disclosure.

In a sixth embodiment shown in FIG. 6, the solar charger 100 may further comprise: a first current sensor 601 configured to detect an input current at the positive input end of the charging unit 103 and to provide the input current detected by the first current sensor 601 to the control unit 104, so that the control unit 104 can adjust the duty ratio of the MOSFET Q1 according to the input current detected by the first current sensor 601 and the voltage input into the charging unit 103. This can adjust the output loading power, and also adjust the output power of the solar harvesting device (not shown) that provides an input voltage to the charging unit 103. This can thus allow the solar harvesting device to reach the maximum output power. In FIG. 6, the solar charger 100 further comprises: a second current sensor 602 configured to detect an output current at an output end of the charging unit 103 and to provide the output current detected by the second current sensor 602 to the control unit 104. Thus, the control unit 104 can calculate the output loading power and the charging efficiency of the solar charger 100.

The switch unit S1 shown in FIGS. 5 and 6 is a service switch configured to facilitate the disassembly of the solar charger 100.

A preferred charging flow of the solar charger 100 is described with reference to the steps in the flow chart shown in FIG. 7 as follows:

S71—starting the solar charger when the voltage that has been transformed from the solar energy and input into the solar charger rises to the second predetermined value (for example, 80 V);

S72—starting to charge the power battery according to communicating instructions from Control Area Network (CAN) of the external control devices (such as the battery manager) when the current light intensity detected by the solar charger is higher than the first predetermined value (for example, a value of no less than 50 lux), and stopping charging of the power battery if the external control devices send instructions of fast or slow charging;

S73—detecting the voltage of the power battery and sending a message (for example, a message showing a current state of the solar charger) via a CAN bus while charging the power battery;

S74—stopping charging of the power battery and detecting the current light intensity periodically (for example, averagely every 3 minutes) if the current light intensity detected by the solar charger is lower than the first predetermined value during charging of the power battery; and when the current light intensity reaches the first predetermined value, continuing charging of the power battery;

S75—during charging of the power battery, if the message sent by the external control devices comprises instructions of fast charging or slow charging, the solar charger stopping the charging of the power battery, and after completing the process of fast or slow charging, if the current light intensity detected by the solar charger is higher than the first predetermined value, continuing charging of the power battery;

S76—stopping charging of the power battery when the voltage of the power battery detected by the solar charger reaches the saturation value (for example, 570 V); and S77—detecting the voltage of the power battery periodically (for example, at intervals of 30 minutes), and if the voltage of the power battery is lower than the saturation value, continuing charging of the power battery.

Figure 7:
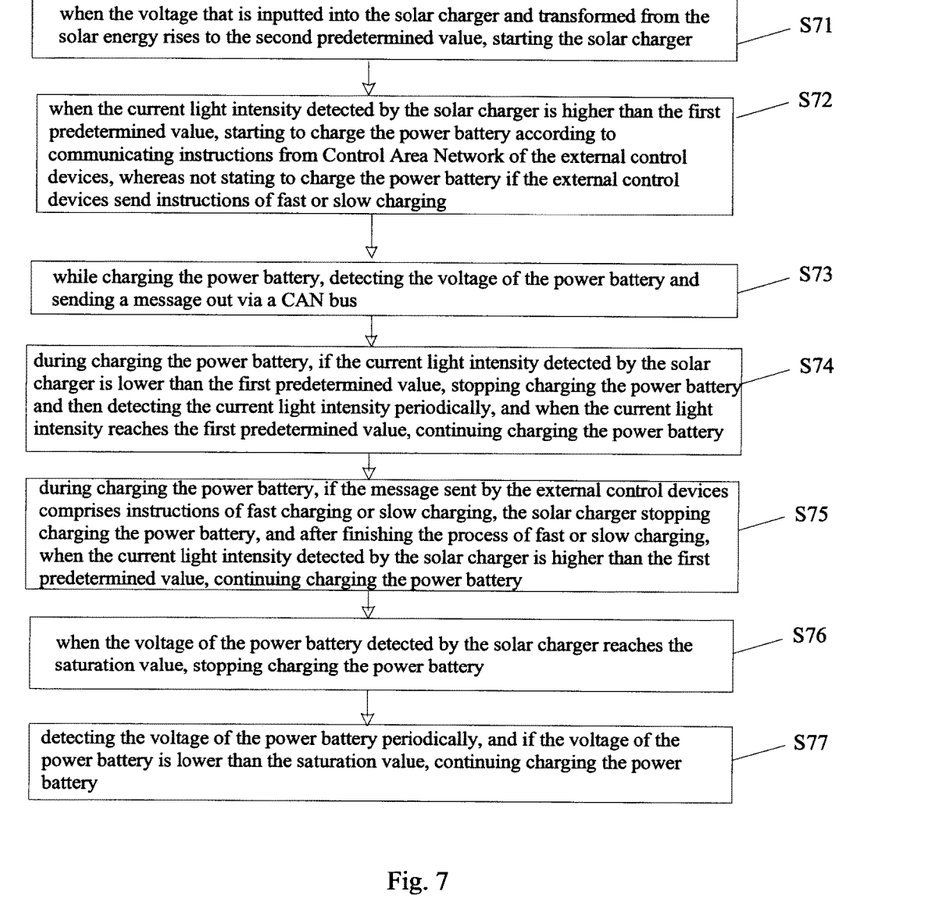
FIG. 7 is a flow chart of the charging process of the solar charger according to an embodiment of the present disclosure.

It is noted that the charging flow shown in FIG. 7 is an exemplary flow, and that some steps in the flow may be omitted or changed depending on actual operating conditions. For example, after step S77, if the solar charger 100 receives the instructions of fast charging or slow charging, the process of fast charging or slow charging may be performed first.

The charging flow shown in FIG. 7 allows the power battery of an electric bus or vehicle to be charged using solar energy and when the bus/vehicle is being driven. The charging flow also prevents damage to the power battery due to large currents, maintains the performance of the power battery, and prolongs the operating life of the power battery. Moreover, because the solar charger may operate differently according to different instructions from the external control devices, the operating state of the solar charger can be controlled in a flexible manner.

Although explanatory embodiments have been shown and described, it would be appreciated by those skilled in the art that changes, alternatives, and modifications can be made in the embodiments without departing from spirit and principles of the disclosure. Such changes, alternatives, and modifications all fall into the scope of the claims and their equivalents.

The invention claimed is:

1. A solar charger for charging a power battery, comprising:
   a photo-sensitive unit configured to detect light intensity;
   a charging unit configured to receive a voltage transformed from solar energy and to boost the voltage for charging the power battery;
   a switch unit coupled between the charging unit and the power battery, and configured to disconnect the charging unit from the power battery or connect the charging unit with the power battery; and a control unit coupled to each of the photo-sensitive unit, the switch unit, and the charging unit, and configured to switch on the charging unit and the switch unit when the light intensity is higher than a first predetermined value to charge the power battery, wherein the control unit is further configured to monitor a voltage of the power battery during charging of the power battery by sampling at the output end of the solar charger, and to switch off the charging unit and the switch unit when the voltage of the power battery reaches a saturation value, wherein the control unit is further configured to periodically switch on the switch unit at regular intervals to detect a current voltage of the power battery after the voltage of the power battery reaches a saturation value, and to switch on the charging unit and the switch unit to charge the power battery when the current voltage of the power battery is lower than the saturation value and the light intensity detected by the photo-sensitive unit is higher than the first predetermined value.

2. The solar charger of claim 1, wherein the regular intervals for periodically switching on the switch unit ranges from 10 minutes per interval to 50 minutes per interval.

3. The solar charger of claim 1, wherein the first predetermined value is no less than 50 lux.

4. The solar charger of claim 1, further comprising a diode having a positive end coupled to an output end of the switch unit and a negative end coupled to the power battery to prevent the voltage of the power battery from affecting the output voltage sampling at the output end of the solar charger.

5. The solar charger of claim 1, further comprising:
a power supply unit coupled to the control unit, and configured to receive and stabilize the voltage transformed from the solar energy to power the control unit, wherein the control unit operates when the voltage transformed from the solar energy reaches a second predetermined value.

6. The solar charger of claim 5, wherein the second predetermined value is no less than 12 V.

7. The solar charger of claim 1, further comprising:
a cooling unit coupled to the control unit, and configured to cool the solar charger when a temperature of the solar charger detected by the control unit reaches a third predetermined value.

8. The solar charger of claim 7, wherein the third predetermined value ranges from 40° C. to 100° C.

9. The solar charger of claim 1, wherein the control unit is further configured to periodically compare a current light intensity detected by the photo-sensitive unit with the first predetermined value, to switch off the charging unit and the switch unit if the current light intensity is lower than the first predetermined value, and to switch on the charging unit and the switch unit if the current light intensity is higher than the first predetermined value.

10. The solar charger of claim 9, wherein a periodic time for periodically comparing the light intensity with the first predetermined value ranges from 0.5 minute to 10 minutes.

11. The solar charger of claim 10, wherein the control unit is further configured to communicate with an external control device and to control the charging unit and the switch unit according to instructions from the external control device.

12. The solar charger of claim 11, wherein the control unit is further configured to switch off the charging unit and the switch unit if the control unit receives instructions of fast or slow charging.

13. The solar charger of claim 1, wherein the charging unit comprises:
a first capacitor having a first end coupled to a positive input terminal of the solar charger and a second end coupled to a negative input terminal of the solar charger;
a first inductance having a first end coupled to the positive input terminal of the solar charger;
a first diode having a positive end coupled to a second end of the first inductance;
a MOSFET having a gate electrode coupled to the control unit, a drain electrode coupled to the second end of the first inductance, and a source electrode coupled to the second end of the first capacitor; and
a second capacitor having a first end coupled to a negative end of the first diode and a second end coupled to the second end of the first capacitor.

14. The solar charger of claim 13, further comprising:
a second diode having a positive end coupled to the positive input terminal of the solar charger and a negative end coupled to a positive input end of the charging unit.

15. The solar charger of claim 13, further comprising:
a third diode having a positive end coupled to an output end of the switch unit and a negative end coupled to the power battery.

16. The solar charger of claim 13, further comprising:
a first current sensor configured to detect an input current at the positive input end of the charging unit, wherein the control unit adjusts a duty ratio of the MOSFET according to the input current detected by the first current sensor.

17. The solar charger of claim 16, further comprising:
a second current sensor configured to detect an output current at an output end of the charging unit, wherein the control unit determines a charging efficiency of the solar charger according to the output current detected by the second current sensor.

18. A solar charger for charging a power battery, comprising:
a photo-sensitive unit configured to detect light intensity;
a charging unit configured to receive a voltage transformed from solar energy and to boost the voltage for charging the power battery;
a switch unit coupled between the charging unit and the power battery, and configured to disconnect the charging unit from the power battery or connect the charging unit with the power battery;
a control unit coupled to each of the photo-sensitive unit, the switch unit, and the charging unit, and configured to switch on the charging unit and the switch unit when the light intensity is higher than a first predetermined value to charge the power battery, and
a power supply unit coupled to the control unit, and configured to receive and stabilize the voltage transformed from the solar energy to power the control unit, wherein the control unit operates when the voltage transformed from the solar energy reaches a second predetermined value no less than 80 V, and
wherein the control unit is further configured to monitor a voltage of the power battery during charging of the power battery, and to switch off the charging unit and the switch unit when the voltage of the power battery reaches a saturation value, wherein the control unit is further configured to periodically switch on the switch unit at regular intervals to detect a current voltage of the power battery after the voltage of the power battery reaches a saturation value, and to switch on the charging unit and the switch unit to charge the power battery when the current voltage of the power battery is lower than the saturation value and the light intensity detected by the photo-sensitive unit is higher than the first predetermined value.

19. A solar charger for charging a power battery, comprising:

a photo-sensitive unit configured to detect light intensity;

a charging unit configured to receive a voltage transformed from solar energy and to boost the voltage from no less than 80 V up to 570 V for charging the power battery;

a switch unit coupled between the charging unit and the power battery, and configured to disconnect the charging unit from the power battery or connect the charging unit with the power battery; and a control unit coupled to each of the photo-sensitive unit, the switch unit, and the charging unit, and configured to switch on the charging unit and the switch unit when the light intensity is higher than a first predetermined value to charge the power battery, wherein the control unit is further configured to monitor a voltage of the power battery during charging of the power battery, and to switch off the charging unit and the switch unit when the voltage of the power battery reaches a saturation value, wherein the control unit is further configured to periodically switch on the switch unit at regular intervals to detect a current voltage of the power battery after the voltage of the power battery reaches a saturation value, and to switch on the charging unit and the switch unit to charge the power battery when the current voltage of the power battery is lower than the saturation value and the light intensity detected by the photo-sensitive unit is higher than the first predetermined value.

* * * * *